United States Patent [19]

Friedl

[11] Patent Number: 4,794,326
[45] Date of Patent: * Dec. 27, 1988

[54] TRANSDUCER FOR CURRENT MEASUREMENTS

[75] Inventor: Richard Friedl, Brunswick, Fed. Rep. of Germany

[73] Assignees: LGZ Landis; Gyr ZUG AG, both of Zug, Switzerland

[*] Notice: The portion of the term of this patent subsequent to Apr. 1, 2003 has been disclaimed.

[21] Appl. No.: 582,968

[22] Filed: Feb. 23, 1984

[30] Foreign Application Priority Data

Mar. 2, 1983 [CH] Switzerland ............... 1137/83

[51] Int. Cl.⁴ .................. G01R 1/20; G01R 15/02; H01C 7/00
[52] U.S. Cl. .................. 324/117 R; 324/126; 324/127; 338/49
[58] Field of Search ............ 324/127, 117 H, 126, 324/117 R; 338/49

[56] References Cited

U.S. PATENT DOCUMENTS

| | | | |
|---|---|---|---|
| 4,182,982 | 1/1980 | Wolf et al. | 324/127 |
| 4,240,059 | 12/1980 | Wolf et al. | 338/49 |
| 4,309,655 | 1/1982 | Leinhard et al. | 324/117 R |
| 4,580,095 | 4/1986 | DeVries | 324/126 |

FOREIGN PATENT DOCUMENTS

| | | |
|---|---|---|
| 2734729 | 8/1978 | Fed. Rep. of Germany . |
| 3008308 | 12/1980 | Fed. Rep. of Germany . |
| 618043 | 6/1980 | Switzerland . |
| 8301535 | 4/1983 | World Int. Prop. O. . |

*Primary Examiner*—Ernest F. Karlsen
*Attorney, Agent, or Firm*—Marmorek, Guttman & Rubenstein

[57] ABSTRACT

A transducer for current measurements includes a flat conductor with at least two main current branches for the current to be measured and at least a cross-branch current bridge connecting two locations of differing potential of the two main current branches. A magnetic core is laid around one of the branch current paths. The flat conductor is formed such that it is provided in its cross-direction with a bending edge for redirecting current and each main current branch or part thereof at least approximately coincides with and is of an opposite current direction to a main current branch or part thereof of the other leg.

19 Claims, 3 Drawing Sheets

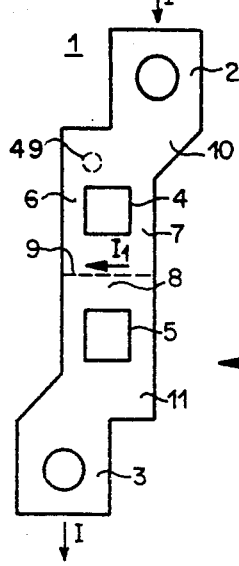
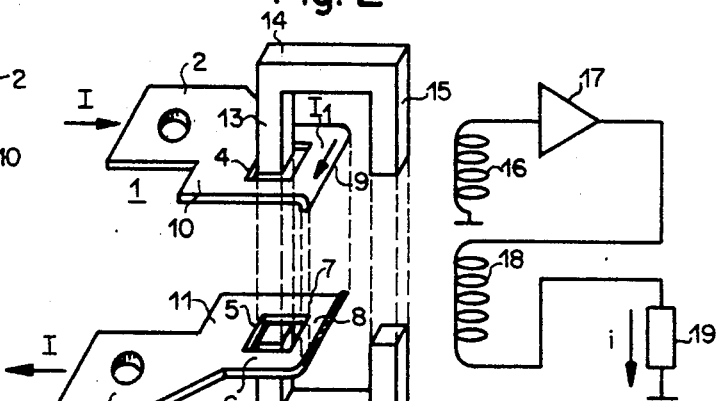
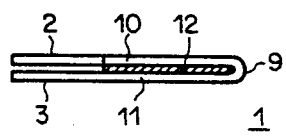
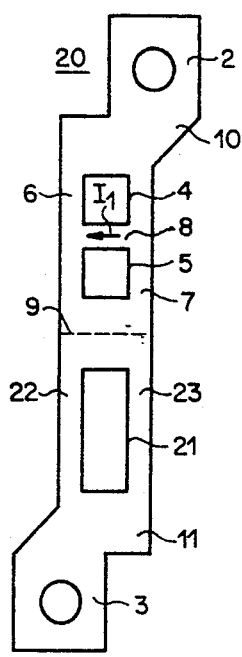
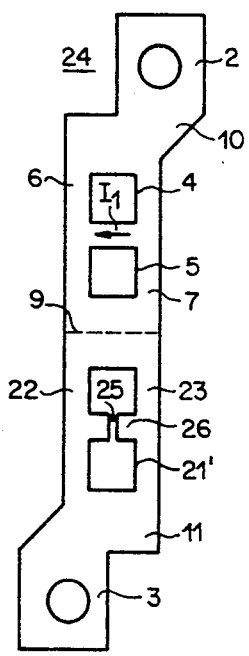

TRANSDUCER FOR CURRENT MEASUREMENTS

BACKGROUND OF THE INVENTION

1. Field of the Invention

The present invention relates to a measurement transducer for current measurements, which is formed of at least two main current branches for the current to be determined and a cross-branch current bridge connecting two locations of differing electrical potential of the two main current branches.

2. Brief Description of the Background of the Invention Including Prior Art

Transducers for current measurements are known. U.S. Pat. No. 4,182,982 teaches a current sensing transducer with first and second conductive members having an insulation layer electrically insulating the two members. Conductors are connected to opposite terminal ends of the conductor. The current runs in the same parallel direction at corresponding positions on the first and second conductive member. Four electrical terminals are shown and terminals with different polarity are at opposite ends of the transducer longitudinal direction. Thus a considerable length of the line conductor for the current has to be available for cutting out and substituting with the transducer of the reference.

U.S. Pat. No. 4,240,059 is the current state-of-the-art in transducers. Disclosed in this patent is a transducer formed as a relatively narrow band with a circular piece in the middle. This embodiment requires the removal of a substantial length of the current line conductor for insertion. Also disclosed in this patent is a transducer formed as a substantially rectangular piece. These structures do not provide the highest accuracy, nor the lowest possible dependence on temperature, stray field generation, and phase error.

SUMMARY OF THE INVENTION

1. Purposes of the Invention

It is an object of the present invention to provide a transducer which substantially provides a high level of accuracy, a low temperature dependence, a small generated stray field and a small phase error.

It is another object of the present invention to provide a current transducer which can be inserted into short lengths of a line conductor, the current of which is to be measured.

It is a further object of the present invention to provide a current transducer which can be economically produced and distributed.

These and other objects and advantages of the present invention will become evident from the description which follows.

2. Brief Description of the Invention

The present invention provides a transducer for measuring a current which comprises a flat conductor including at least two main current branches for the current to be measured, a current redirecting bending edge in the cross direction of the flat conductor, two legs of the flat conductor joined at the current redirecting bending edge such that each main current path or part of a main current path of one leg of the flat conductor is at least approximately coinciding with and with opposite current direction over a main current path or part of main current path of the other leg, and at least a cross-current path connecting two positions of differing electrical potential of two main current paths with each other. A magnetic core is passed by the cross-current bridge, where the cross-current bridge carries a partial current depending on the potential differences between the two positions, permeating the magnetic core.

The two legs of the flat conductor can be electrically insulated from each other and are in a close thermal contact. The flat conductor can include a current redirecting bending edge along the longitudinal symmetry line of the cross-branch current bridge. The first leg of the flat conductor can be provided with two main current branches and one cross branch current bridge and where the second leg is provided with two further main current branches. The second leg of the flat conductor can be provided with a conductor branch interrupted by an air slot, which conductor path coincides with the cross-branch current bridge. The second leg of the flat conductor can be provided with a cross-branch current path, which coincides with the cross-branch current path of the first leg. The two arms of the flat conductor can be formed substantially alike. The flat conductor can be folded in its cross direction. The flat conductor has a cast part and a pressed part. The flat conductor can be provided with a recess parallel to the current redirecting bending edge for receiving of at least one electrical winding.

The terminals of the transducer for providing connection to the power line can be separated by a slot which is less than about a quarter of the width of the terminals. At least one of the legs can be provided with two openings for receiving the arms of a magnetic core, where the two arms substantially overlap each other, and where a substantial deviation from overlapping between the two legs is provided in the area between the two openings. The transducer can be in the operational transducing region provided as a band of conducting metal having openings for the magnetic core in each band leg for overlapping and passing of the magnetic core and where a small region of one of the legs differs from the form of the other leg for providing a asymmetry of the current flow in the two legs and for thereby generating a magnetic force proportional to the total current.

There is further provided a method for measuring of a current with a transducer which comprises providing a band of metal with essentially parallel sides over the middle region, bending the metal band at about the middle for providing two overlapping legs of flat conductors, providing an opening in the two legs for allowing the insertion of a magnetic core, providing an additional opening in one of the two legs such as to assure some asymmetry in the magnetic flux lines generated by the two legs from the opposite direction at each corresponding point, and disposing a magnetic core into the openings.

A pick-up coil can be placed around the magnetic core. An electrical insulator can be placed between the parts overlapping after the bending. An electrically nonconducting heat conductor can be positioned between the parts overlapping after the bending.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention:

FIG. 1 is a schematic view of an unfolded flat conductor according to the present invention, FIG. 2 is an exploded view of a transducer according to the present invention, FIG. 3 is a schematic view of the folded flat conductor of FIG. 1.

FIG. 4 is a view of another embodiment of a transducer,

FIG. 5 is a view of another embodiment of a transducer,

FIG. 6 is a view of another embodiment of a transducer,

DESCRIPTION OF INVENTION AND PREFERRED EMBODIMENTS

Figures 7A, 7B:
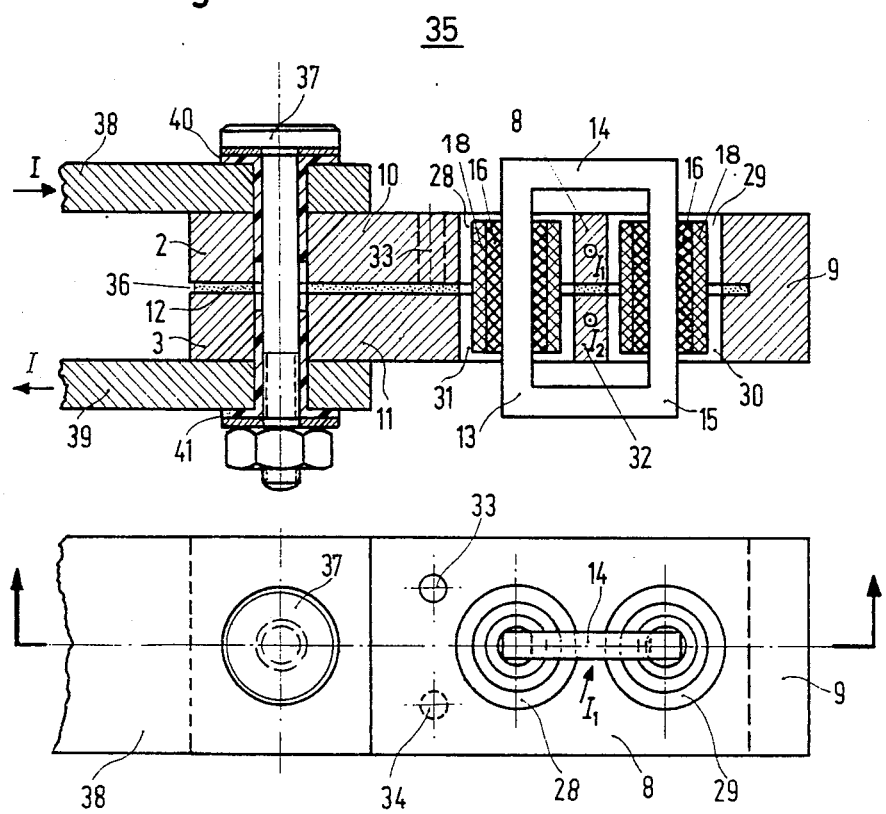
FIGS. 7A and 7B are views of a transducer produced from a solid block.

In accordance with the present invention there is provided a transducer for measurement of a current based on a flat conductor, which comprises at least two main current branches for the current to be measured and at least a cross-branch current bridge connecting at least two positions of differing potential of two main current branches to each other. A partial current flows through the cross-branch current bridge, dependent upon the potential difference between the two locations inducing the magnetic core. The flat conductor 1, 20, 24, 27, 35, 42 is formed such and is provided in its cross-direction with a reversing edge or, respectively, a bending edge 9 such that each main current branch 6, 7 or, respectively, part of a main current branch 6, 7 of one of the legs 10 of the flat conductor 1, 20, 24, 27, 35, 42 is at least approximately coinciding and is disposed above a main current branch 22, 23, or, respectively, part of a main current branch 6, 7 of the other leg with opposite current direction.

The two arms 10, 11 of the flat conductor 1, 20, 24, 27, 35, 42 are insulated electrically from each other and are in a close joint contact. The flat conductor 1 can be provided along the longitudinal symmetry line of the cross-branch current bridge 8 with a direction reversing edge or, respectively, a bending edge 9. The first leg 10 of the flat conductor 20, 24, 27, 35, 42 can comprise two main current branches 6, 7 and cross-branch current bridge 8 and a second leg 11 can be provided with two further main current branches.

The second leg 11 of the flat conductor 24 can be provided with a conductor branch 26 which coincides with the cross-branch current bridge 8 and which is interrupted by an air gap 25. The second arm 11 of the flat conductor 27, 35, 42 can be provided with a cross-branch current bridge which coincides with the cross-branch current bridge 8 of the first leg 10. The two legs 10, 11 of the flat conductor 1, 20, 24, 27, 35, 42 are at least of about equal shape. The flat conductor 1, 20, 24, 27 can be folded in its cross-direction. The flat conductor 35, 42 can comprise a cast or a pressed part. A recess 43 parallel to the reversing edge 9 is provided in the flat conductor 42 for accepting at least one electrical winding 16, 18.

The reference numeral 1 designates in FIGS. 1 and 3 a flat conductor of constant thickness comprising a single sheet of metal, which conductor 1 is provided in each case at its ends with in each case a connecting terminal 2, 3. The current I to be determined flows via the terminal 2 through the flat conductor 1 and leaves the flat conductor 1 via the connection 3. Two holes 4, 5 are disposed between the terminal connections 2, 3 of the flat conductor 1, which subdivide the flat conductor 1 in two main current branches 6, 7 and into a cross-branch current bridge 8. The cross-branch current bridge 8 connects, similar to a non-balanced electrical bridge circuit, two positions of differing potential of the main current bridges 6, 7 to each other so that a partial current $I_1$ of the current I to be measured flows, which under the presumption of a constant current distribution in the flat conductor 1 is proportional to the current I to be measured.

The longitudinal symmetry line of the cross-branch current bridge 8 coincides with a redirecting edge or bending edge 9, which subdivides the flat conductor into two legs 10, 11. Advantageously, the two legs 10, 11 are formed of approximately equal length. They are distinguishable only by a small shape difference from each other, which is required for the generation of the current flow in the cross-branch current bridge 8. The partial current $I_1$ in the cross-branch current path 8 results in the example shown from the side staggering of the connections 2, 3. The required partial difference between the two ends of the cross-branch current bridge 8 can also be achieved or, respectively, increased by other steps, such as for example the removal of material at the edge of one of the legs 10, 11 by way of a light mutual shifting of the holes 4, 5 with respect to each other or based on the application of a further hole 49 shown in FIG. 1 as a dashed line disposed in the leg 10. The legs 10 and 11, apart from the sideways staggered terminal connectors 2 and 3 are mirror symmetrical. The flat conductor 1 is folded in its cross-direction at the bending edge 9 according to FIGS. 2 and 3, that is it is folded by 180 degrees, such that it represents the shape of a U. After the folding the first half corresponding to the leg 10 of the main current branch 6 or 7 coincides with the second half corresponding to the leg 11 of the same main current branch or, respectively, 7, where the flow direction of the current of main current branch halves is opposite, The holes 4, 5 are also coinciding after the folding, while the connector terminals are staggered sideways. The two legs 10, 11 are electrically insulated versus each other via a thin insulating layer 12 (FIG. 3) and are in close mutual thermal contact. The one arm 13 of a closed magnetic core 14 (FIG. 2) penetrates the holes 4, 5, while the other arm 15 of the magnetic core 14 closes the magnetic circle outside of the flat conductor 1.

The transducer described operates in the representative illustration as an active current transformer. For this purpose, a detector winding 16 disposed on the magnetic core 14 is connected to the input of the amplifier 17, the output of which has connected a series connection comprising a secondary winding 18 and a series connection 19.

The flat conductor 1 represents the primary winding of the transducer. The partial current $I_1$, which flows in the cross-branch current path 8 running through the magnetic core 14, is responsible for the primary permeation. The compensation of the primary permeation is provided as is known by a current I flowing in the secondary winding 18, which current is controlled by the amplifier 17 in a control circuit such that the voltage induced in the detector winding 16 goes to zero.

A close thermal contact results from the described folding of the flat conductor 1 between the two legs 10, 11, wherefrom a nearly ideal temperature balancing results and thus a current distribution independent of the strength of the current I to be measured is assured in the flat conductor 1 and a very high measurement accuracy is achieved. Since both the main current branch 6 as well as the main current branch 7 in opposite current direction extend over the two legs 10, 11, a substantially induction-free circuit results with only a small stay field generation and thus also a very small phase error.

The flat conductor 20 is shown in FIG. 4, where the same or, respectively, the same way responding parts as those of FIG. 1 having the same reference numerals.

The holes 4 and 5, the main current branches 6 and 7 as well as the cross-branch current bridge 8 are disposed in the leg 10. The leg 11 is provided with a hole 21, which subdivides this leg into two further main current branches 22, 23. The dimensions of the hole 21 correspond to the enveloping curve of the holes 4, 5 such that after folding of the flat conductor 20 around the bending edge 9 the holes 4, 5 and the cross-branch current bridge 8 disposed between them coincide with the hole 21. In addition, the main current branch 6 is disposd coincidingly over the main current branch 22 after the folding and the main current branch 7 is disposed coincidingly over the main current branch 23, where the current flow direction of main current branches 6, 20 or, 7, 23 disposed on top of each other is opposite. The hole 4 is associated with the leg 13 (FIG. 2) of the magnetic core 14 and the hole 5 is associated with the leg 15 of the magnetic core, while the hole 21 is passed by the two legs 13, 15 such that again the partial flow $I_1$ in the cross-branch current bridge 8 is responsible for the primary permeation of the magnetic core 14.

It can be easily recognized that the same advantageous effects occur with the flat conductor 20 as with the flat conductor 1. Since the two legs 13, 15 of the magnetic core 14 permeate the flat conductor 20, there results a substantially symmetrical arrangement and thus also a high insensitivity against outside interfering fields.

The flat conductor 24 shown in FIG. 5 is distinguished from the flat conductor 20 only by the different shape of the hole 21, which is designated as 21' in FIG. 5 and which is shaped such that a conductor path 26 interrupted by a narrow air gap 25 is generated. After the folding of the flat conductor 24 the interrupted conductor branch 26 coincides with the cross-branch current bridge 8 disposed below and it supports its optimum heat contact with the remaining parts of the flat conductor 24.

In case the conductor branch 26 is not interrupted by an air gap, then it forms a second cross-branch current bridge, wherein a second partial current flows permeating the magnetic core 14. An example for such a flat conductor is shown in FIG. 6.

The flat conductor 27 according to FIG. 6 is provided with four circular holes 28 to 31 disposed successively in its longitudinal direction. The holes 28 and 29 subdivide the leg 10 into the two main current branch 6, 7 and the cross-branch current bridge 8, the holes 30 and 31 subdivide the leg 11 into the two main current branches 22, 23 and one second cross-branch current bridge 32. The required potential difference between the two positions of the main current branches 6, 7 or, respectively, 22, 23 which are connected to each other by the cross-branch current bridges 8 or respectively, 32, is effected by a further small hole 33 or, respectively, 34 in the leg 10 or, respectively, 11. The holes 28, 29 coincide with the holes 31, 30 after the folding of the flat conductor 27. A partial current $I_2$ flows in the cross-branch current bridge 32, which is also proportional to the current I to be measured. If the one arm of the magnetic core 14 passes through the hole pair 28, 31 and the other arm passes through the hole pair 29, 30, then the sum $I_1+I_2$ of the two partial currents $I_1$ and $I_2$ is responsible for the primary permeation.

An electrically insulated ferromagnetic bow not shown in the drawing can be stuck onto the folded flat conductor in order to compensate angle errors such that it connects for example the main current paths 6 and 22. A fine phase balancing can be easily achieved by shifting such a bow.

The shape of the folded primary flat conductor can also be produced immediately from a cast part or continuous pressed part. This is particularly advantageous in the production of accurate high current transducers with automatic tool machines.

A simple embodiment of a flat conductor 35 produced in this manner is shown in FIG. 7. It is formed from an electrically good conducting metal parallelepiped, which is subdivided into two conductor legs 10 and 11 and the form and effect of which corresponds to that of the folded flat conductor according to FIG. 6. The two legs 10 and 11 are connected to each other by a thermally well conducting electrically insulating layer 12. The two legs 10 and 11 are connected to each other with the thermally well conducting electrically insulating layer 12. The two legs 10 and 11 are disposed here mirror symmetrical relative to the redirection edge 9 on top of each other in order to provide also a better thermal balancing between the two connections 2 and 3. The connection can be provided by insertion of the connectors 2 and 3 into a correspondingly formed connection piece or by screw-attaching the connector lines 38, 39 with a single screw connector 37, whereby the two connection conduits 38 and 39 are pressed at the connectors 2 and 3 in each case with the same pressure. The screw 37 is insulated from the current carrying parts based on corresponding insulating shells 40, 41.

An aluminum sheet anodized on the two sides is advantageously suited as a material for the insulation layer to be entered in the slot 36. This assures a particularly good thermal transfer between the legs 10 and 11.

The function of the flat conductor 35 according to FIG. 7 corresponds to that of the mechanically folded flat conductor according to FIG. 6. The detector winding 16 and the secondary winding 18 in each case with half the number of windings surround the two arms 13 and 15 of the closed magnet core 14 according to this arrangement of the primary flat conductor 35. The windings 16 and 18 are here disposed in hole pairs 28, 29 and 30, 31 of the legs 10, 11 placed on top of each other. The same descriptions as they are recited above for the folded flat conductor 27 according to FIG. 6. are valid here for the permeation of the magnet core 14.

Figure 8:
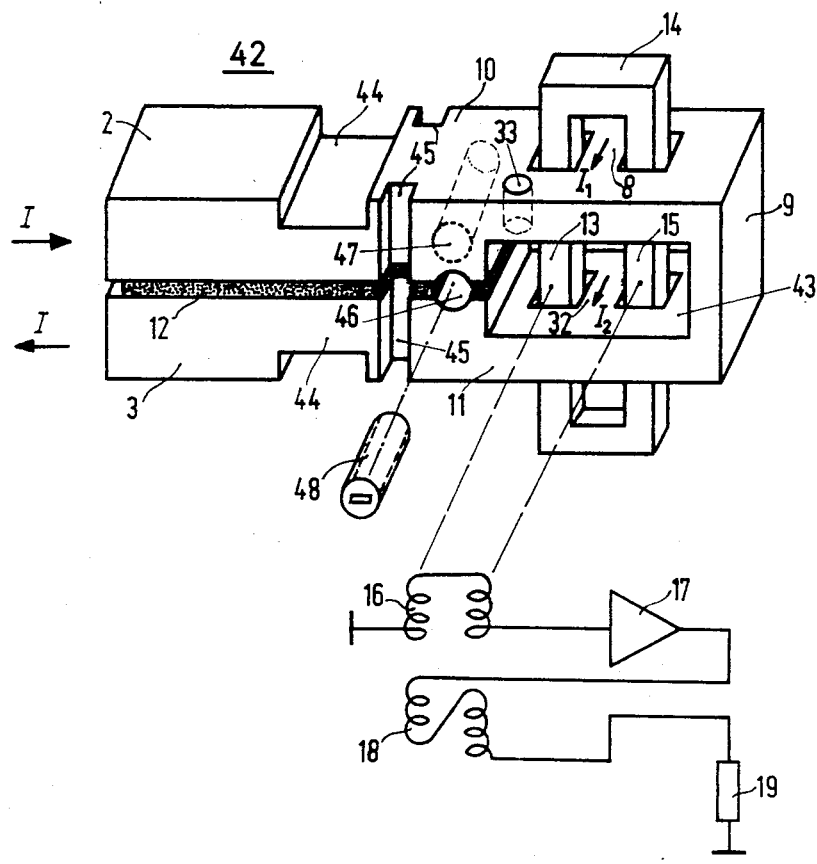
FIG. 8 is a view of another transducer produced from a solid block.

A further example of a flat conductor 42 milled out of a cast or pressed part is shown in FIG. 8. Here the windings 16 and 18 placed in half in each case onto the arms 13, 15 of the magnetic core 14 are surrounded by the legs 10 and 11 and a recess 43 is provided parallel to the redirecting edge 9. This results in the advantage that the magnetic field between the legs 10 and 11 is substantially reduced at the locations of the passage of that or of the arms 13, 15 of the magnetic core 14, which avoids substantially a local saturation of the magnetic core 14. The thermal balancing between the legs 10 and 11 can be completed again by casting a good thermally conducting insulating mass into the recess 43. Here the holes 28 to 31 are provided rectangular for the reception of the magnetic core as compared with the example of FIG. 7. In addition, the narrowings 44 and 45 of the conductors are provided in the two legs 10 and 11 in order to render independent the distribution of the current I to be measured in the flat conductor 42 of the changes of the transistion resistors of the following conductors to the connection terminals 2, 3 and thereby to make the current distribution of the current I to be measured independent of different current distributions and different temperatures between the connectors 2 and 3.

In addition, a ferromagnetic bolt 48 is provided for the balancing of the phase angle, which influences the inductive component of the resistance of one of the conductor branches passing the arms of the magnetic core 14 based on more or less depth of insertion into a bore 46 between the arms 10 and 11 or, respectively, into a bore 47 in one of the legs of the flat conductors 42 such that no phase difference exists between the total flux passing the magnetic core and the current I to be measured.

The magnetic situation of the transducers described can be even more favorable if the detector winding 16 and the secondary winding 18 are not disposed on the arms 13 and 15, but are disposed half at the top and half at the bottom on the cross-branch of the magnetic core 14.

The detector winding 16 can be eliminated if a magnetic field sensor is disposed at the input of the amplifier 17, which field sensor can sense the magnetic field in an air gap of the magnetic core 14.

The detector winding 16 can be eliminated if a magnetic field sensor is connected at the input of the amplifier 17, which magnetic field sensor senses for example the magnetic field in an air gap of the magnetic core 14.

The transducer described can also be operated as a time-coded transformer according to the teaching of the Swiss Patent No. CH-PS 618,043. Then the parts 16 to 19 are eliminated, an alternating resonance flux permeation is superimposed to the primary flux permeation of the magnetic core 14 with a premagnetization coil and the points in time of the passages through zero of the resulting magnetic field are sense with a magnetic field sensor disposed in an air gap of the magnetic core 14.

It will be understood that each of the elements described above, or two or more together, may also find a useful application in other types of measurement system configurations and current measuring procedures differing from the types described above.

While the invention has been illustrated and described as embodied in the context of a transducer for current measurements, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A transducer for measuring a current, comprising, a magnetic core,
   a U-shaped electrical conductor comprising two legs connected along one end, said U-shaped electrical conductor having a longitudinal axis generally perpendicular to said one end and located in a central portion of said U-shaped electrical conductor, said two legs being in a generally confronting relationship to each other and in close thermal contact with one another, but spaced apart from each other by a thin insulation layer, each of said legs having an opening defined therein for receiving said magnetic core,
   said magnetic core being positioned to engage each opening in each leg; and
   each of said legs including a connecting terminal, said connecting terminals operable for providing a plurality of currents in said legs when energized by being connected to an electrical source,
   said currents including two main currents along each of said two legs generally parallel to said longitudinal axis, said main currents in each of said legs being on opposite sides of said longitudinal axis, the direction of flow of said main currents in one leg being opposite to the direction of flow of said main currents in the other leg,
   said U-shaped electrical conductor including physical differences with respect to said longitudinal axis so as to produce a cross-current flowing between said main currents when said U-shaped electrical conductor is energized, said cross-current being located near said one end,
   whereby, an electrical source can be connected to said connecting terminals to produce currents in said legs thereby generating a magnetic flux from said cross-current which is coupled to said magnetic core.

2. The transducer of claim 1 wherein said physical differences include at least one additional opening defined in at least one of said legs, said additional opening producing a difference in electrical potential between said main currents in the corresponding leg.

3. The transducer of claim 1 wherein said two legs are asymmetrical with respect to each other.

4. The transducer of claim 1 wherein each of said legs comprises a cast part.

5. The transducer of claim 1 wherein each of said legs comprises a pressed part.

6. The transducer of claim 1, wherein said connecting terminals are separated from each other by a slot which is less than approximately a quarter of the width of said connecting terminals.

7. A transducer for measuring a current, comprising, a magnetic core having two arms,
   a U-shaped electrical conductor comprising first and second legs interconnected along one end, said U-shaped electrical conductor having a longitudinal axis generally perpendicular to said one end and located in a central portion of said U-shaped electrical conductor, said first and second legs being in a generally confronting relationship to each other and in close thermal contact with one another, but spaced apart from each other by a thin insulation layer, said first leg including two openings defined successively along said longitudinal axis, each of said openings receiving one arm of said magnetic core, said second leg including one opening and receiving both arms of said magnetic core, said magnetic core being positioned to engage each opening in each leg; and each of said first and said second legs including a connecting terminal, said connecting terminals operable for providing a plurality of currents in said legs when energized by being connected to an electrical source, said currents including two main currents along each of said first and said second legs generally parallel to said longitudinal axis, said main currents being on opposite sides of said longitudinal axis, the first direction of flow of said main currents in said first leg being opposite to the direction of flow of said main currents in said second leg, said U-shaped electrical conductor including physical differences with respect to said longitudinal axis so as to produce a cross-current flowing between said main currents when said U-shaped electrical conductor is energized, said cross-current being located near said one end, whereby, an electrical source can be connected to said connecting terminals to produce currents in said legs thereby generating a magnetic flux from said cross-current which is coupled to said magnetic core.

8. The transducer of claim 7 wherein one of said legs of the conductor includes a conductor branch interrupted by an air slot, said conductor branch coinciding with the region of flow of the cross-current.

9. The transducer of claim 7 wherein said two legs of said conductor are formed substantially alike.

10. The transducer of claim 7 wherein the conductor comprises a cast part.

11. The transducer of claim 7 wherein the conductor comprises a pressed part.

12. The transducer of claim 7, wherein said connecting terminals being separated from each other by a slot which is less than approximately a quarter of the width of said connecting terminals.

13. A transducer for measuring a current, comprising, a magnetic core having two arms, a U-shaped electrical conductor comprising first and second legs interconnected along one end, said U-shaped electrical conductor having a longitudinal axis generally perpendicular to said one end and located in a central portion of said U-shaped electrical conductor, said first and second legs being in a generally confronting relationship to each other and in close thermal contact with one another, but separated from each other by a thin insulation layer, said magnetic core being positioned to engage each opening in each leg; and said first and second legs each including two openings disposed successively along said longitudinal axis, each of said openings receiving an arm of said magnetic core, and each of said first and said second legs including a connecting terminal, said connecting terminals operable for producing a plurality of currents in said first and second legs when energized by being connected to an electrical source, said currents including two main currents along said first and second legs generally parallel to said longitudinal axis, said main currents on said first leg being opposite to the direction of flow of said main currents in said second leg, said U-shaped electrical conductor including physical differences with respect to said longitudinal axis so as to produce a cross-current flowing between said main currents when said U-shaped electrical conductor is energized, said cross-current being located near said one end, whereby, an electrical source can be connected to said connecting terminals to produce currents in said legs thereby generating a magnetic flux from said cross-current which is coupled to said magnetic core.

14. The transducer of claim 13 wherein one of said legs includes a conductor branch interrupted by an air slot, said conductor branch coinciding with the region of flow of one of the cross-currents.

15. The transducer of claim 13 further comprising a hole disposed in at least one of said legs, said hole causing a difference in potential between said main currents in the other leg.

16. The transducer of claim 13 wherein said two legs are formed substantially alike.

17. The transducer of claim 13 wherein said conductor comprises a cast part.

18. The transducer of claim 13 wherein said conductor comprises a pressed part.

19. The transducer of claim 13 further comprising terminals of said transducer for providing a connection to the voltage source, said terminals being separated by a slot which is less than approximately a quarter of the width of the terminals.

* * * * *